United States Patent

Okita

[11] Patent Number: 6,097,453
[45] Date of Patent: Aug. 1, 2000

[54] DISPLAY APPARATUS AND FABRICATION PROCESS THEREOF

[75] Inventor: Akira Okita, Yamato, Japan

[73] Assignee: Canon Kabushiki Kaisha, Tokyo, Japan

[21] Appl. No.: 08/867,494

[22] Filed: Jun. 2, 1997

[30] Foreign Application Priority Data

Jun. 4, 1996 [JP] Japan ................................. 8-162445
May 21, 1997 [JP] Japan ................................. 9-130683

[51] Int. Cl.[7] ................................................. G02F 1/136
[52] U.S. Cl. ............................................................ 349/43
[58] Field of Search ................................. 399/42, 146, 147, 399/138; 257/59, 72

[56] References Cited

U.S. PATENT DOCUMENTS

| 5,644,370 | 7/1997 | Miyawaki et al. | 349/43 |
| 5,721,596 | 2/1998 | Kochi | 349/42 |
| 5,844,647 | 12/1998 | Maruno et al. | 349/110 |

FOREIGN PATENT DOCUMENTS

| 663697A1 | 7/1995 | European Pat. Off. | H01L 29/786 |
| 689085A2 | 12/1995 | European Pat. Off. | G02F 1/136 |
| 0714140A1 | 5/1996 | European Pat. Off. | H01L 29/786 |
| 5055582 | 3/1993 | Japan | H01L 29/784 |
| 6132306 | 5/1994 | Japan | H01L 21/336 |
| 832083 | 2/1996 | Japan | H01L 29/786 |

OTHER PUBLICATIONS

Patent Abstracts of Japan, vol. 017, No. 356 (E–1394) Jul. 6, 1993.
Patent Abstracts of Japan, vol. 018, No. 419 (E–1589) Aug. 5, 1994.

*Primary Examiner*—Frank G. Font
*Assistant Examiner*—Michael P. Stafira
*Attorney, Agent, or Firm*—Fitzpatrick, Cella, Harper & Scinto

[57] ABSTRACT

In an active matrix type liquid-crystal display apparatus using polycrystal silicon as semiconductor devices of switching elements, leakage current of the switching elements is prevented, large driving current is achieved, and rise characteristics of current in the sub-threshold region are improved, thereby realizing high-pixel-number and high-definition image display.

For this, a surface of an insulating layer of silicon nitride film 102 is oxidized to form an insulating layer of silicon oxide film 111 surface roughness of which is 2 nm or less, and a polycrystal silicon layer is formed thereon to form TFTs.

3 Claims, 7 Drawing Sheets

DISPLAY APPARATUS AND FABRICATION PROCESS THEREOF

BACKGROUND OF THE INVENTION

1. Field of the Invention

The present invention relates to a display apparatus using a liquid crystal and, more particularly, to a display apparatus using an active matrix substrate with thin-film switching elements.

2. Related Background Art

In recent years the display apparatus using the liquid crystal are required to achieve higher-definition display images. Among others, display panels of the so-called active matrix type using the thin-film switching elements for drive of pixels are under rapid technological development, because they are relatively easy to achieve increases in the number of pixels and in tone levels as compared with liquid crystal display panels of the other types.

The thin-film switching elements used in the above active matrix type display panels are thin film transistors (TFTs) which normally use amorphous silicon (a-Si) mainly for 5-inch or greater large-scale panels or polycrystal silicon (p-Si) mainly for small-scale panels smaller than 5 inches. FIG. 11 shows a schematic view of a liquid crystal panel using p-Si-TFTs out of them. Vertical shift register 1103 and horizontal shift register 1104 are connected to panel display circuit 1105 including the p-Si-TFTs arrayed in a matrix pattern, as switching elements, and TV image signals transmitted from video signal circuit 1101 are written through the vertical shift register 1103 and horizontal shift register 1104 in the pixels in the display circuit 1105. Numeral 1102 designates a synchronous circuit for achieving timing between the two shift registers 1103, 1104. Recently, there is such a trend that the shift registers 1103, 1104 are made of p-Si-TFTs and that they are integrated in the same panel.

FIG. 10 shows a cross-sectional view of an example of p-Si-TFT. In thin film p-Si on quartz or glass substrate 1001 there are source and drain regions, for example, of $n^+$-type diffused layer 1003 and $n^-$-type diffused layer 1007 and control of on/off is made by applying voltage to gate electrode 1006 made of p-Si through gate insulating layer 1005. The $n^-$-type diffused layer 1007 is formed especially for the purpose of relaxing the electric field immediately below the gate electrode and in the vicinity of the drain. Numeral 1008 denotes the source/drain electrode, for example, of aluminum, 1010 a layer insulation film, for example, of a silicon oxide film, and 1009 a surface protection film, for example, of a silicon nitride film.

The provision of the above $n^-$-type diffused layer 1007 relaxes the electric field immediately below the gate near the drain, which decreases the leakage current between the drain and the source, occurring in performing the off operation as being an important characteristic of TFT. There is another method for increasing the thickness of the gate insulating film 1005, thereby decreasing the leakage current and also increasing the withstand voltage of the gate insulating layer.

In the inverse stagger type TFTs, attempts have been made to increase mobility by decreasing surface roughness of the interface between a-Si layer (channel region) and gate insulating layer by anodization, thereby improving characteristics and reliability of transistor (the bulletin of Japanese Laid-open Patent Application No. Hei 8-32083). It is widely known in general that to smooth the interface between the channel region and the gate insulating layer not only in the TFTs but also in bulk Si is very fundamental in improving the characteristics of MOS transistor.

FIG. 12 shows an equivalent circuit in the display section of the liquid crystal panel shown in FIG. 11. A plurality of signal lines 1201a to 1201d and a plurality of scanning lines 1202a to 1202d are connected to the transistors and each scanning line 1202a to 1202d is connected to the gate. A video signal from the signal line 1201a to 1201d is written in pixel electrode 1206. The drain of TFT 1203 is also connected to holding capacitor 1204 for holding a charge written therein for a sufficiently long period, and the other end 1205 of electrode of the capacitor is connected to a common potential to the all pixels or to the pixels in one row.

The conventional active matrix type display apparatus using the p-Si-TFTs as switching elements, however, involved the technological problems described below.

Specifically, it is necessary to provide the long $n^-$-type diffused layer 1007 as a field relaxing layer in order to sufficiently decrease the leakage current between the drain and the source, but it lowers the driving current of TFT. It also increases the size of element, thereby making the increases in the definition and density difficult. If the thickness of gate insulating layer is increased, rise characteristics of current will become insufficient in the sub-threshold region of TFT.

SUMMARY OF THE INVENTION

An object of the present invention is to provide a display apparatus, solving the above problems, that can achieve high-pixel-number and high-definition image display using the p-Si-TFTs well suppressing the leakage current between the drain and the source, having large driving current, and having good rise characteristics of current in the sub-threshold region.

The display apparatus of the present invention is a display apparatus comprising a liquid crystal between an active matrix substrate, having pixel electrodes each of which is provided through a thin film transistor at each intersecting point between a plurality of signal lines and a plurality of scanning lines perpendicular to the signal lines, and an opposite substrate having an opposite electrode disposed opposite to the active matrix substrate, wherein in the above active matrix substrate the thin film transistors have a semiconductor layer of a polycrystal silicon layer provided on an insulating layer surface roughness of which is 2 nm or less and wherein gate electrodes are disposed on the semiconductor layer.

In the display apparatus of the present invention, p-Si making the semiconductor layer of TFT is formed on the smooth insulating layer the surface roughness of which is 2 nm. Therefore, higher characteristics of transistor and an improvement in reliability cannot be achieved only by improving the interface between the channel region and the gate insulating layer, but also by improving the surface nature of the interface not contacting the gate insulating layer among the channel region specific to the TFT. Specifically, it becomes possible to relax concentration of the electric field in a small region between the source and the drain or between the gate and the source/drain, which can decrease the leakage current between the source and the drain and the leakage current between the gate and the source/drain, the leakage currents being important characteristics of transistor.

In the display apparatus of the present invention, silicon nitride or silicon oxide is suitably used for the above insulating layer and a particularly preferable structure is a double-layered structure in which a silicon oxide layer is provided on a silicon nitride layer. When silicon nitride is provided immediately below p-Si of TFT, it can supply hydrogen to TFT. When silicon oxide is provided, diffusion of hydrogen of TFT is suppressed and the film with small surface potential is in contact therewith. Thus, the characteristics of TFT can be improved in either case.

In the display apparatus of the present invention, the active matrix substrate is preferably a single-crystal silicon substrate and it is transparentized by removing a part of the substrate, thus forming a transmission type display apparatus. In this case, high-speed drive becomes possible by constructing a peripheral driving circuit of elements using single-crystal silicon, thereby achieving high-definition of panel.

The display apparatus of the present invention may be constructed in either one of the transmission type, the reflection type, and the projection type and may be constructed as a goggle-type display apparatus.

The present invention further provides a fabrication process of the above display apparatus, wherein a fabrication step of the active matrix substrate comprises steps of providing a polycrystal silicon layer on an insulating layer made by forming a silicon nitride layer and thereafter thermally oxidizing a surface of the silicon nitride layer to form a silicon oxide layer and constructing the foregoing thin film transistors using the polycrystal silicon layer as a semiconductor layer thereof.

In the present invention the above silicon nitride layer can be formed preferably by the low pressure CVD process or by the plasma enhanced CVD process.

The display apparatus of the present invention attains the following effects.

(1) The leakage current is decreased in the off operation of pixel TFT.

(2) The leakage current is decreased between the gate electrode and the source/drain of pixel TFT.

The above effects of (1) and (2) in turn attain the following effects.

(3) The above effect (1) makes it possible to narrow the width of field relaxed region of TFT, so that the size of TFT can be made smaller, which improves the aperture rate of pixel or increases the density of pixel, thus improving the driving performance. Therefore, high-contrast and high-definition display images are realized.

(4) The above effect (2) makes it possible to decrease the thickness of the gate insulating layer of pixel TFT, which improves the rise characteristics of current in the sub-threshold region of TFT and which can realize high-definition display images.

DETAILED DESCRIPTION OF THE PREFERRED EMBODIMENTS

Figure 1:
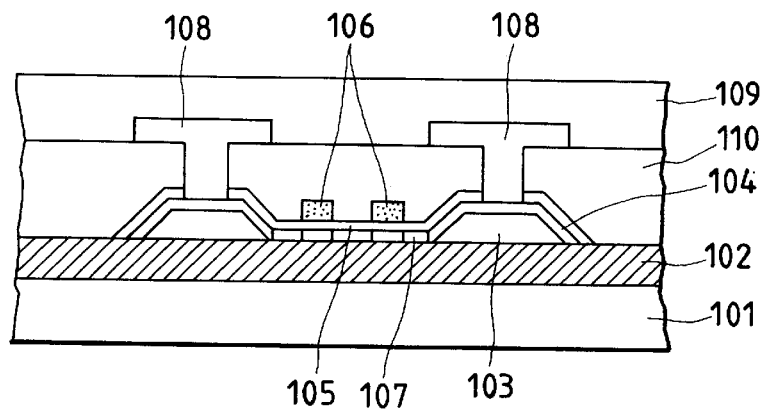
FIG. 1 is a cross-sectional view to show an example of TFT applicable to the display apparatus of the present invention.

The present invention will be described in detail with embodiments thereof, but it should be noted that the present invention is by no means intended to be limited to these embodiments. In the drawings, the same portions will be denoted by the same reference symbols and redundant description will be omitted.

[Embodiment 1]

FIG. 1 is a schematic, cross-sectional view of $n^+$-type p-Si-TFT applicable to the display apparatus of the present invention. In FIG. 1, insulating layer 102 is disposed on semiconductor or quartz substrate 101 and the channel and source/drain of TFT are formed on the insulating layer 102. Numeral 103 designates high-concentration source/drain, and 104 a p-Si layer. Numeral 107 denotes low-concentration source/drain for relaxing the electric field. Numeral 105 represents the gate insulating layer, for example, of a silicon oxide film and 106 does p-Si, for example, doped in the n-type, thus composing so-called "dual gate TFT" wherein two equipotential gate electrodes 106 are present in series between the source and the drain.

Numeral 110 stands for a layer insulation film, for example, made of PSG (Phospho-Silicate Glass) and 108 for the source/drain electrode, for example, made of aluminum.

Numeral 109 denotes a hydrogen supply source for hydrogenation of TFT, which is, for example, a silicon nitride film. The silicon nitride film 109 also serves as a surface protection film in the present example, which prevents water, impurities, and the like from intruding from the outside into the inside, thus securing the reliability of TFT. The silicon nitride film 109 as a hydrogen supply source can be made by decomposing and depositing in a plasma a gas mixture of silane gas with ammonia gas or a gas mixture of silane gas with $N_2O$ (laughing gas), excited under low pressure and at temperatures of 200 to 400° C. It is important that the layer insulation film 110 be a film with a high diffusion rate of hydrogen. Hydrogenation proceeds to some extent during deposition of the silicon nitride film 109, but, in order to achieve the sufficient effect, it is better to carry out after deposition a thermal treatment at temperatures of 350 to 500° C., in hydrogen gas or in a gas mixture of hydrogen gas with an inert gas such as nitrogen, for 10 to 120 minutes. The upper limit of the treatment temperature at this time is determined by the melting point of aluminum electrode or the desorption reaction of hydrogen. When aluminum is used, the thermal treatment over 500° C. is not desirable.

The effect of hydrogenation is also degraded above 500° C. This is because hydrogen once captured in grain boundaries of p-Si starts desorbing.

The most characteristic component in the present invention is the insulating layer 102. The insulating layer 102 needs to have a surface the fine roughness of which is very small. This surface roughness greatly affects the leakage current value ($Id_{leak}$) in carrying out the off operation and the leakage current value ($Ig_{leak}$) between the gate electrodes 106 and the source/drain 103, which are important characteristics of $n^+$-type p-Si-TFT. Specifically, the smaller the surface roughness, the smaller the values of $Id_{leak}$ and $Ig_{leak}$, thereby improving the characteristics of $n^+$-type p-Si-TFT.

Figure 9:
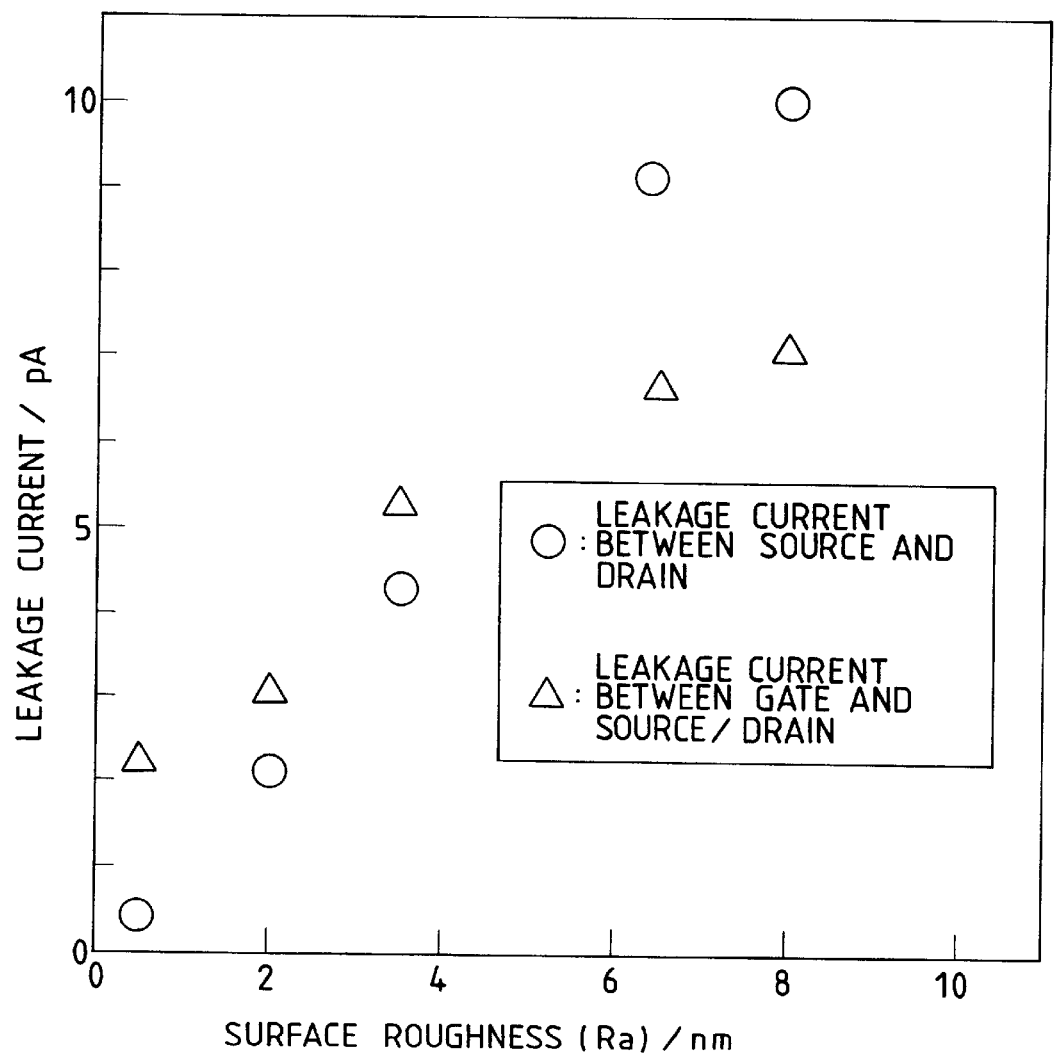
FIG. 9 is a drawing to show surface roughness dependence of leakage current value between the gate and the source/drain of TFT and that between the source and the drain thereof.
Figure 10:
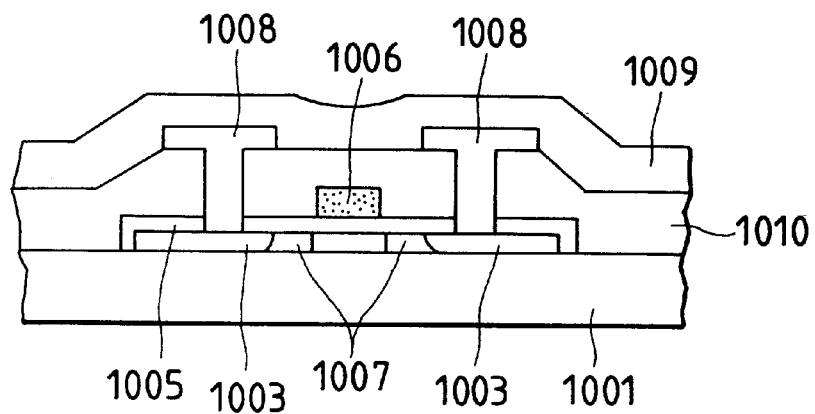
FIG. 10 is a cross-sectional view to show the structure of conventional p-Si-TFT.
Figure 11:
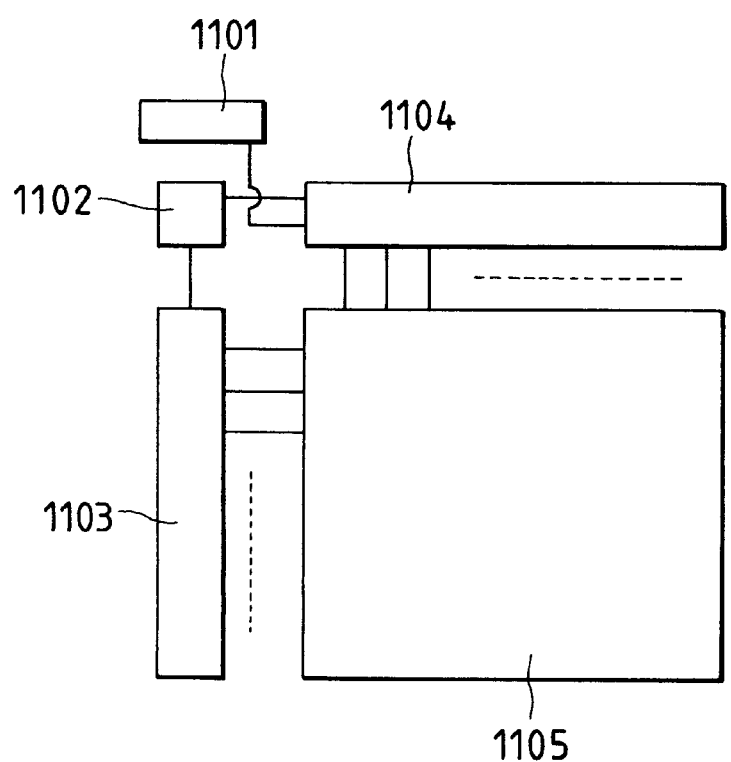
FIG. 11 is a schematic drawing of the liquid crystal panel using the p-Si-TFTs.
Figure 12:
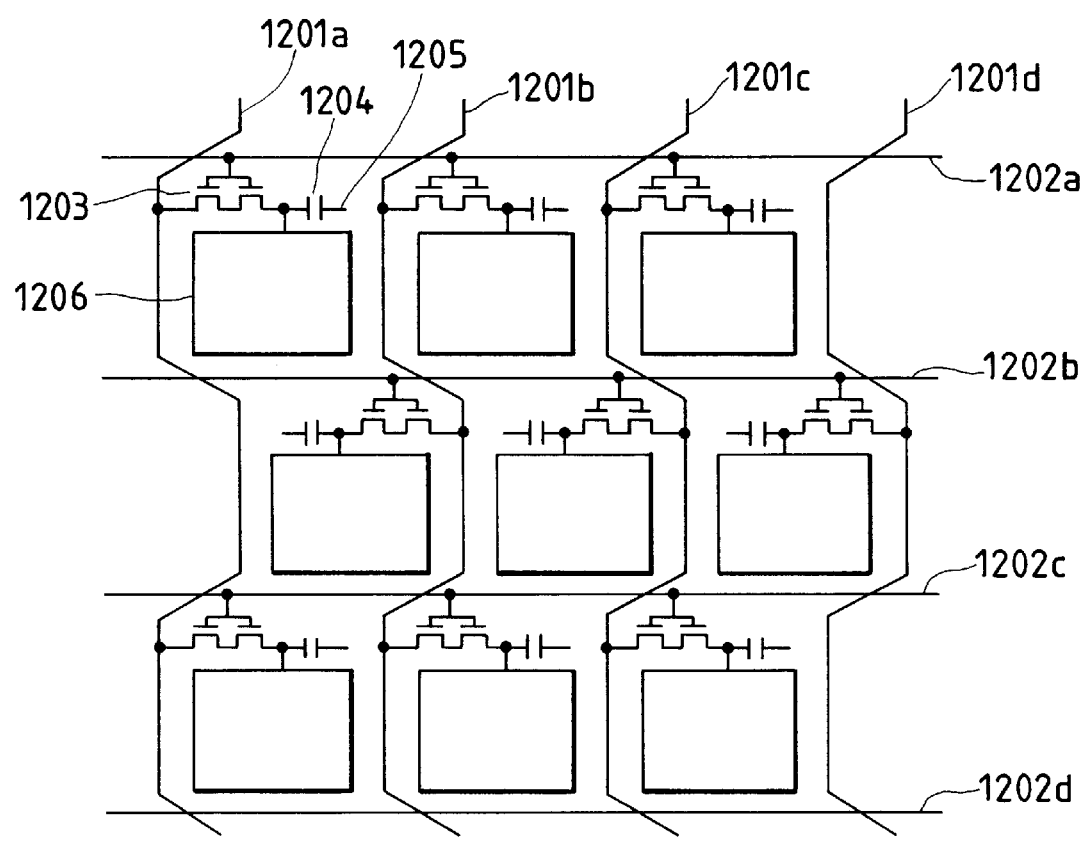
FIG. 12 is an equivalent circuit diagram in the display section of the liquid crystal panel shown in FIG. 11.

FIG. 9 shows surface roughness dependence of leakage current value between the gate and the source/drain. It is seen that the leakage current values are low in the region where the surface roughness is 2 nm or less and further that better characteristics are achieved in the surface roughness region of 0.5 nm or less.

A fabrication process of the TFT shown in FIG. 1 is as follows.

If the substrate 101 is a semiconductor substrate, a silicon oxide film will be formed by thermal oxidation, thereby making the insulating layer 102. It is noted herein that the insulating layer 102 is made so that the surface roughness thereof $R_a$ is 2 nm or less. For obtaining the silicon oxide film with good surface nature, there are, for example, methods for processing the surface thereof with $H_2$ at high temperatures (900° C. or above) or for depositing an epitaxial film, which are carried out before the thermal oxidation of the semiconductor substrate 101, a method for carrying out cleaning not roughing the surface (cleaning with low-concentration $NH_4OH/H_2O_2$) before the thermal oxidation, and so on.

The insulating layer 102 may be a silicon oxide film obtained by thermal oxidation carried out after deposition of a-Si (amorphous silicon) or p-Si (poly silicon) or may be non-doped silica glass deposited by the CVD process under low pressure. Adjustment of surface roughness may be made by polishing of surface after deposition of the desired insulating layer.

Next, silane gas diluted with nitrogen is thermally decomposed under pressure of 0.1 to 1.0 Torr and at 600 to 700° C. to deposit an a-Si film in the thickness of 50 to 400 nm, and thereafter the a-Si film is patterned to form portions to become the regions of source/drain 103. This is an effective structure for decreasing parasitic resistance of the source and drain regions and for preventing disappearance of the p-Si film of the second layer due to over etch upon etching of source and drain contact holes, but it is not always necessary.

Next, the native oxide film in the surface is removed and the p-Si film 104 of the second layer is deposited in the thickness of 50 to 2000 nm by the low pressure CVD process. The thickness of p-Si is desirably as thin as possible, because the leakage current of TFT can be suppressed by that degree. For example, the p-Si layer is deposited in the thickness of 80 nm, taking account of the next step to form a thermally oxidized film in the thickness of 80 nm at 1150° C. and dispersion of process.

The process for forming the gate insulating layer 105 may be one of a method for simply forming the oxide film, a method for forming an oxide film once and thereafter successively carrying out nitridation and oxidation to form ONO (Oxidized-Nitrided Oxide) film, and so on.

After formation of the gate insulating layer 105, p-Si, becoming the gate electrodes, is deposited in the thickness of 100 to 500 nm and is doped in a high concentration. After that, patterning is carried out to form the gate electrodes 106. Doping of the gate electrodes may be carried out suitably using one of the conventional techniques, including doping of phosphorus ions in vapor phase, ion implantation of arsenic or phosphorus, and ion doping.

Next, the layer insulation film 110 of PSG is deposited in the thickness of 600 nm by the CVD process using silane gas, oxygen gas, and $PH_3$ (phosphine) as raw-material gases. The layer insulation film may be either one of films of NSG (Non-doped Silicate Glass), BPSG (Boron-Phospho Silicate Glass), and so on, in addition to PSG.

The above layer insulation film 110 is perforated to form the contact holes and aluminum doped with 0.5 to 2.0% of silicon is deposited in the thickness of 600 nm by the magnetron sputtering process. The electrode material may be selected from the materials normally used in the semiconductor and TFT processes, for example, from such materials as other aluminum alloys, W, Ta, Ti, Cu, Cr, Mo, or silicides thereof. The electrode material is patterned to form the source and drain electrodes 108 and thereafter a gas mixture of silane gas with $N_2O$ gas is decomposed in a plasma at 200 to 400° C., thereby depositing a silicon nitride film of 600 nm. After that, the resultant is annealed in hydrogen gas and at 400° C. for 30 minutes.

Figure 2:
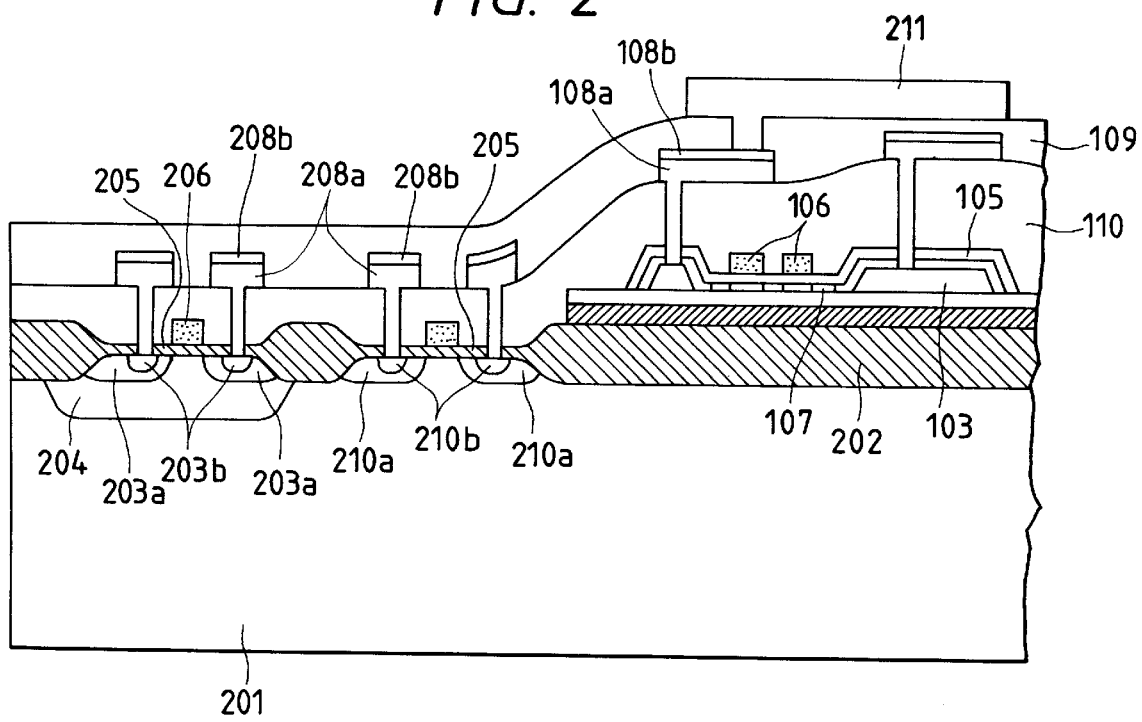
FIG. 2 is a cross-sectional view of the active matrix substrate according to the present invention, to which the TFTs shown in FIG. 1 are applied.

FIG. 2 shows a cross-sectional view of an active matrix substrate fabricated by using above p-Si for the switching elements and integrating the signal-line driving circuit and scanning-line driving circuit including the shift registers in single-crystal silicon. Although in the present embodiment the peripheral driving circuit is of the CMOS structure, it does not have to be limited thereto.

In FIG. 2, reference numeral 201 designates a silicon substrate, 202 a thick silicon oxide film for element isolation, 203a low-concentration source and drain of NMOS transistor, and 203b high-concentration source and drain of NMOS transistor. Numeral 204 denotes p-type well of NMOS transistor, 205 a gate insulating layer, 206 p-Si gate electrode, and 208a, 208b source and drain electrodes. Further, 210a represents low-concentration source and drain of PMOS transistor, 210b high-concentration source and drain of PMOS transistor, and 209 an opaque pixel electrode.

Figure 3:
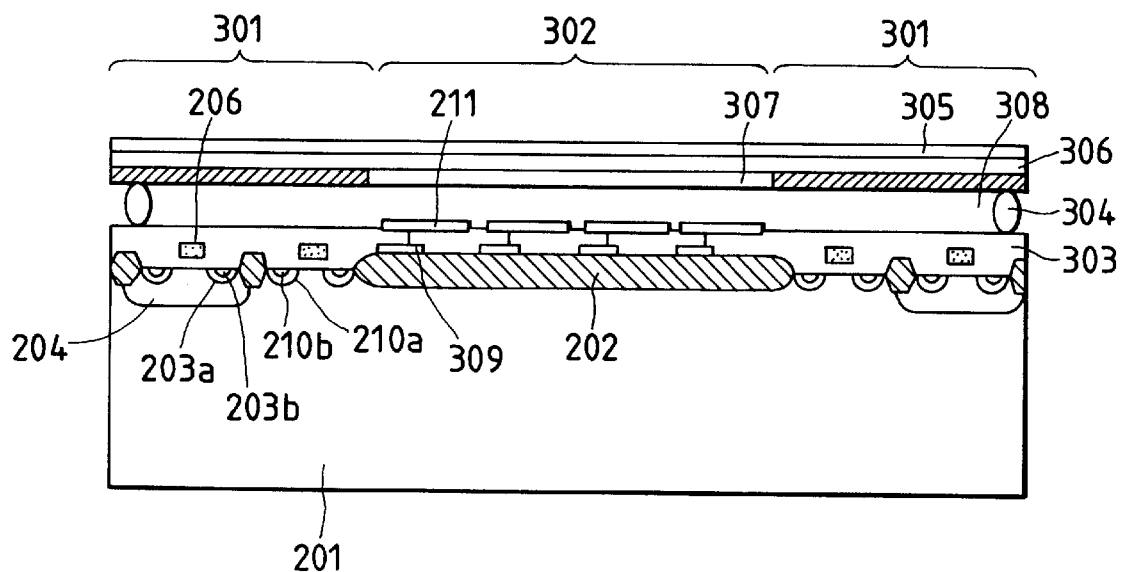
FIG. 3 is a cross-sectional view of an embodiment of the display apparatus according to the present invention.

FIG. 3 shows a cross-sectional view of an example where the active matrix substrate of FIG. 2 is mounted as a liquid crystal display apparatus. The active matrix substrate of FIG. 2 is disposed in parallel to opposite substrate 306 and liquid crystal 308 is sealed in between the two substrates. Spacer 304 is placed for maintaining the thickness of liquid crystal 308 designed in consideration of optical characteristics of liquid crystal.

A transparent common electrode 307 common to the all pixels or common to many pixels is located at the position opposite to the pixel electrodes 211, and a voltage is applied to the liquid crystal 308. Further, numeral 301 denotes the peripheral driving circuit, 302 the display section, 303 an interlayer film, 305 a polarizing plate, and 309 p-Si-TFTs.

An effective liquid crystal 308 is mainly one of TN (Twisted Nematic) liquid crystals, but STN (Super Twisted Nematic) liquid crystals, FLC (Ferroelectric Liquid Crystal), and PDLC (Polymer-Diffused Liquid Crystal) may also be applied structurally. A polarizing plate is necessary in use of TN, STN, or FLC.

The present embodiment employs the TN type liquid crystal as a liquid crystal and image display is made by condensing light with a polarizing beam splitter.

Since in the present embodiment the leakage current of TFT of pixel switch is prevented and the characteristics thereof are improved as compared with the prior art, high-tone-level and high-contrast images can be attained. In addition, since the peripheral driving circuit is constructed of single-crystal silicon TFTs, high-speed drive can be achieved and higher-definition images can be displayed.

Also, high-tone-level and high-contrast images can also be displayed by excluding the polarizing plate 305 from the display apparatus shown in FIG. 3, using PDLC as a liquid crystal, and using a Schlieren optical system.

Further, it is also possible to apply the display apparatus of the present embodiment to a projection type liquid crystal display apparatus using an enlarging optical system and excellent images are also obtained in that application example.

It is also possible to incorporate the display apparatus of the present embodiment in a goggle, thereby displaying identical images on right and left panels or displaying a stereoscopic image.

[Embodiment 2]

Figure 4:
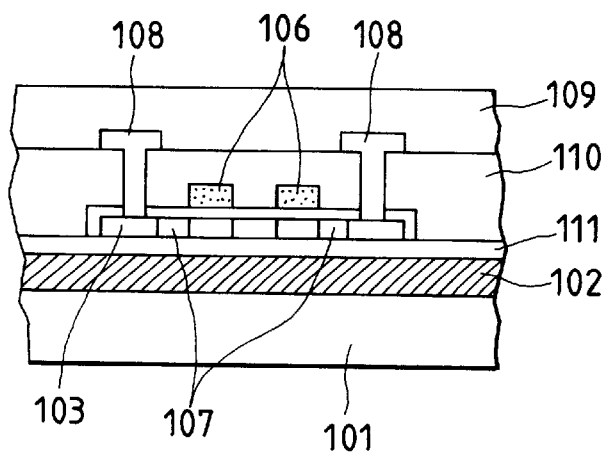
FIG. 4 is a cross-sectional view to show a second example of TFT applicable to the display apparatus of the present invention.

A schematic, cross-sectional view of another TFT used in the display apparatus of the present invention is shown next in FIG. 4 as a second embodiment of the present invention. The present embodiment is different from Embodiment 1 in double-layered structure including one more insulating layer 111 formed on the insulating layer 102. Here, the insulating layer 102 is a silicon nitride film and the surface thereof is oxidized to form a silicon oxide film, thereby forming the second insulating layer 111. The roughness $R_a$ of the surface of this second insulating layer 111 needs to be 2 nm or less.

The following effects are achieved by forming the silicon oxide film on the silicon nitride film and using it as the insulating layer immediately below the p-Si-TFT as in the present embodiment.

(1) Hydrogen diffusing out of the silicon nitride film 109 as a hydrogen supply source is intercepted by the silicon nitride film 102, which can promote hydrogenation of TFT.

(2) By forming the silicon oxide film with good surface nature immediately below TFT, the surface state in the film becomes smaller than in the case of the silicon nitride film, thus achieving good TFT characteristics.

(3) The silicon oxide film becomes an effective etch stopper layer in forming the gate electrodes 106 or TFT.

The above effects are not changed by whether the above silicon nitride film 102 is $Si_3N_4$ by the low pressure CVD process or a nitride film by the plasma enhanced CVD process.

The above silicon oxide film 111 can be formed in the thickness of 250 , for example, by pyrogenic oxidation of the silicon nitride film 102 at 1000° C. for 6 hours.

Figure 5:
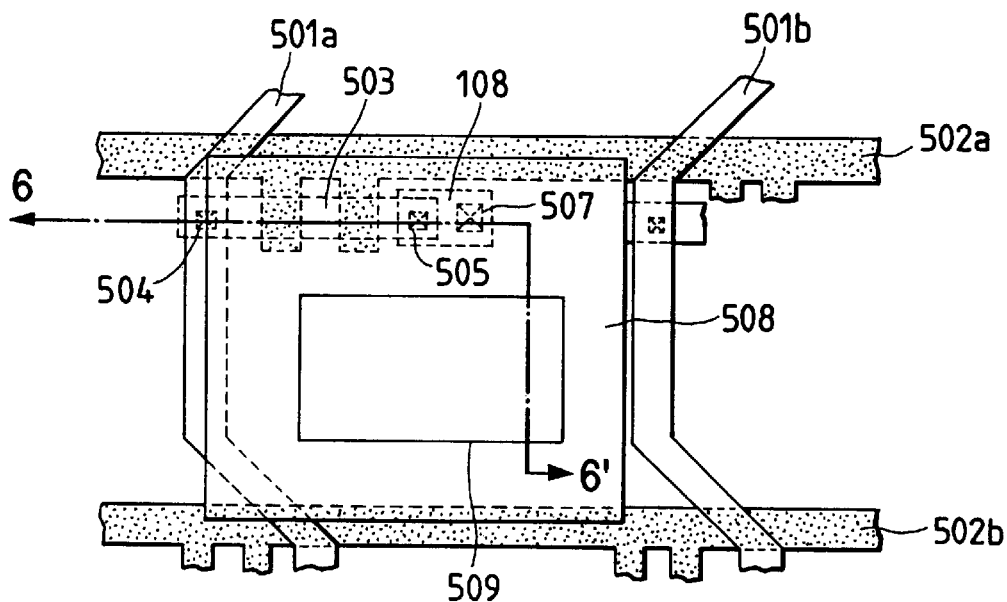
FIG. 5 is a plan view of one pixel in the second embodiment of the display apparatus according to the present invention.
Figure 6:
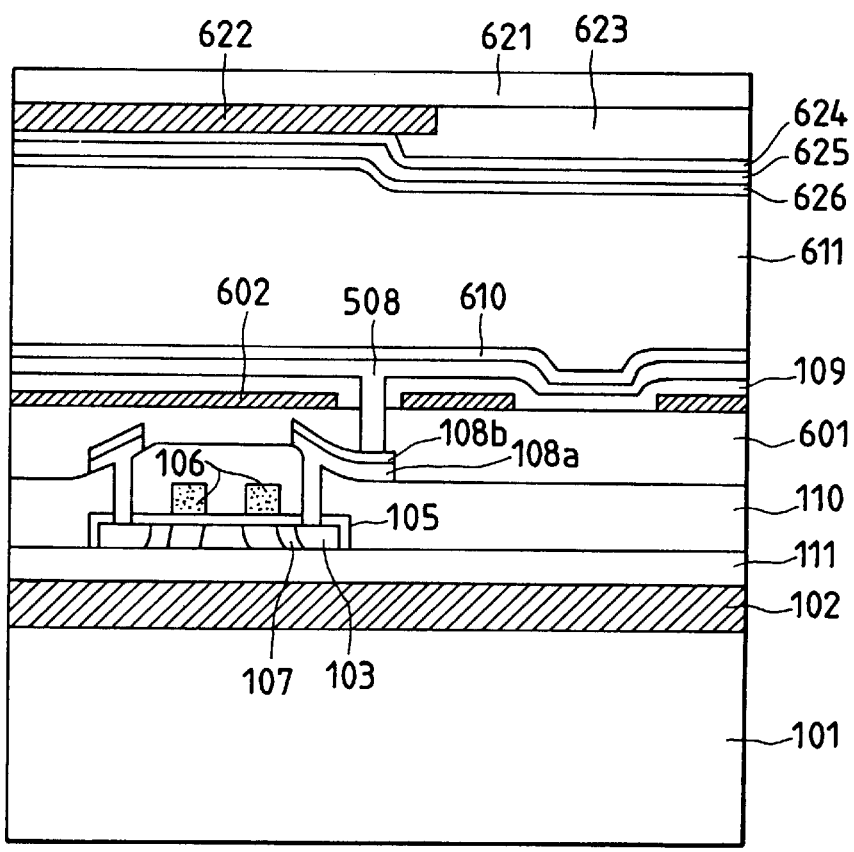
FIG. 6 is a cross-sectional view of the second embodiment of the display apparatus according to the present invention taken along line 6–6' of FIG. 5.

FIG. 5 is a plan view of one pixel of the display apparatus using the above TFTs and FIG. 6 is a cross-sectional view taken along 6–6' in FIG. 5.

In FIG. 5, one pixel is surrounded by two adjacent signal lines 501a, 501b and two adjacent scanning lines 502a, 502b. The source of TFT made of p-Si layer 503 is connected through contact hole 504 to the signal line 501a, and signal charge is written in the drain through the two gate electrodes. Numeral 505 designates a contact for connecting the TFT to metal electrode 108 and this metal electrode 108 is connected through through hole 507 to transparent pixel electrode 508. In FIG. 5, numeral 509 is an opening part of a shield film which prevents unwanted light from impinging on the TFT.

In FIG. 6 the silicon nitride film 102 is disposed on the silicon substrate or quartz substrate 101. The silicon oxide film 111 10 to 100 nm thick is provided on the silicon nitride film 102 to separate the TFT from the silicon nitride film 102. The TFT has the low-concentration n-type layer 107 for relaxing the electric field and the high-concentration source and drain 103, and these are opposite to the two gate electrodes 106 of p-Si with the gate insulating layer 105 in between.

The source electrode and drain electrode 108 are of a lamination of aluminum film 108a and TiN film 108b and facilitate ohmic contact with the pixel electrode 508.

Shield film 602 is constructed, for example, of a Ti film and is separated, for example, by PSG film 601 from the source and drain electrodes and is separated, for example, by BPSG film 110 from the TFT.

In the present embodiment a plasma-nitrided film 109 for hydrogenation is provided between the shield film 602 and the pixel electrode 508. This is for using a film with as large relative permittivity as possible in order to form a holding capacitor between the pixel electrode 508 and the shield film 602. As described, the effect of hydrogenation can be achieved sufficiently on the shield film 602. Also, the PSG film 601 may be made as a nitride film for hydrogenation.

Numeral 610 is an orientation film for orientation of liquid crystal, which is, for example, a polyimide film. The components of from substrate 101 to orientation film 610 shown in FIG. 6 constitute the active matrix substrate.

On the other hand, on the transparent opposite substrate 621 color filter 623, for example using a pigment, is provided corresponding to the opening portion of the shield film 602, while black matrix 622 of Cr or the like is formed corresponding to the shield film 602. In addition, transparent electrode 624, protective film 625, and orientation film 626 are provided over the opposite substrate 621 and the liquid crystal 611 is sandwiched between the active matrix substrate and the opposite substrate 621.

The display apparatus constructed as described above can achieve high-definition liquid-crystal image display in the pixel size of 20 μm or less square. Since the leakage current is little between the source and the drain, the holding period of charge of pixel electrode can be long, thus realizing display excellent in contrast ratio. Further, imperfections such as white dots or black dots are also little and thus the fabrication yield can be improved extremely. The present embodiment can decrease the leakage current between the source and the drain of TFT to one hundredth of the conventionally achieved value and experiences no sudden increase of leakage.

[Embodiment 3]

Figure 7:
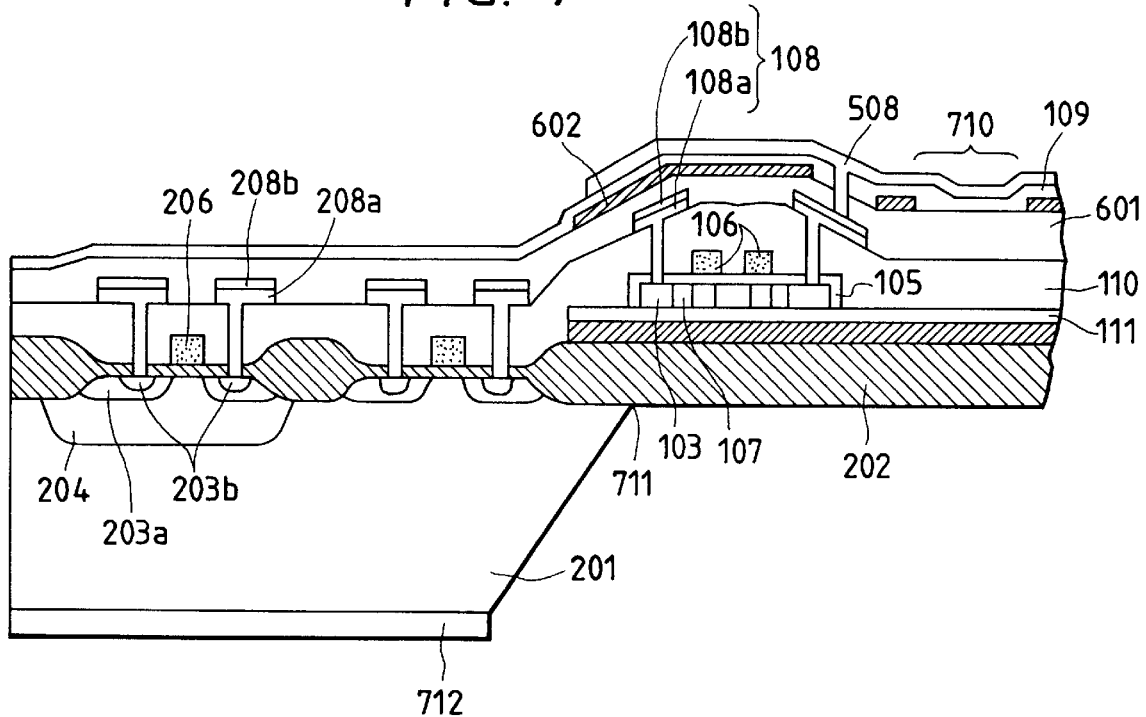
FIG. 7 is a cross-sectional view of the active matrix substrate in the third embodiment of the display apparatus according to the present invention.

FIG. 7 is a cross-sectional view of an active matrix substrate in a transmission type display apparatus wherein the TFT shown in Embodiment 2 is used for pixel switches and wherein the signal-line driving circuit and scanning-line driving circuit including the shift registers are integrated in a single-crystal silicon substrate.

In the present embodiment the peripheral driving circuit is of the CMOS structure, but it is not limited to only this structure.

In FIG. 7 the same portions as those in FIG. 2 are denoted by the same reference symbols and description thereof will be omitted. In FIG. 7, reference numeral 710 designates an opening portion of pixel and substrate silicon of this display section is removed in order to form a transmission type display panel. Numeral 711 denotes the etching edge, which defines the size of display area. Numeral 712 represents a back oxide film, which serves as an etching mask in removing the substrate silicon by etching.

Figure 8:
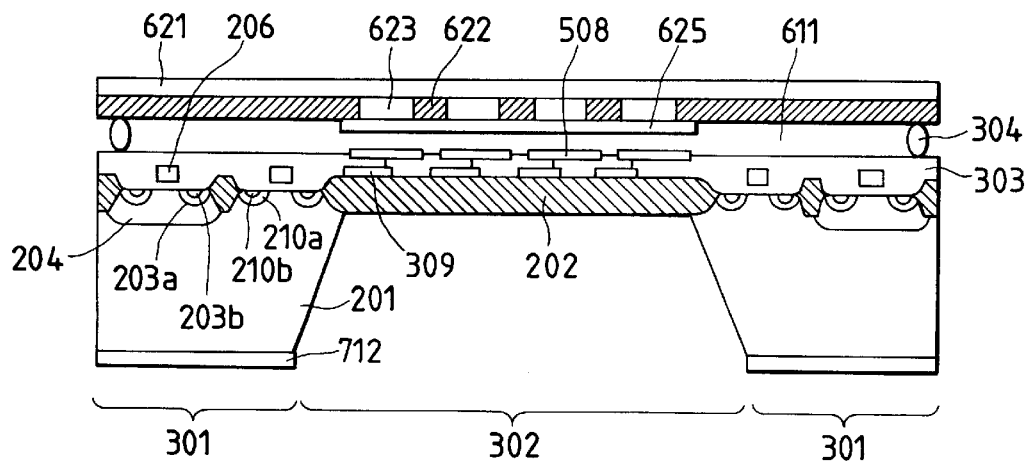
FIG. 8 is a cross-sectional view of the third embodiment of the display apparatus according to the present invention.

FIG. 8 is a cross-sectional view of an example wherein the active matrix substrate of FIG. 7 is mounted as a liquid crystal display apparatus. Also in this figure the same portions as those in FIGS. 1 to 7 described previously are denoted by the same reference symbols and description thereof will be omitted.

In the present embodiment the single-crystal silicon substrate in the display section 302 is removed and this region is made of a transparent membrane, thus realizing the transmission type. The membrane in the present embodiment requires some technique for optimizing the tension thereof as described below. The tension of the membrane is determined by balance between compressive stress and tensile stress of each film forming the membrane with respect to the silicon substrate 201. In the structure of the present embodiment the largest contribution of compressive stress is given by 202 of LOCOS oxide film, which will cause sori (warp) of 45 µm for 5-inch wafer in the case of the thickness of 800 nm, for example. On the other hand, the largest tensile stress is given by the silicon nitride film by the thermal CVD process, which will cause sori of 60 µm in the case of the thickness of 400 nm. The total sori of the other films due to compressive stress is about 15 µm, and thus the sum of sori is almost 0 µm. Considering film decrease of the silicon oxide film 202 in the removing step of single-crystal silicon, slight tensile stress remains finally, which is suitable for making the membrane with good reliability. Without having to be limited to the above design example, it is also possible to design the thickness of silicon oxide film 202 in the range of 200 to 1500 nm and to design the thickness of the nitride film in the range of approximately 10 to 60 nm.

Employing the above structure, the present embodiment can construct the display apparatus realizing high tone levels and high contrast which have never been achieved heretofore. Particularly, since it uses the high-quality single-crystal silicon substrate for the driving circuit, the size of the display apparatus can be decreased and the yield is improved. Further, the yield and reliability of the membrane step are high, so that the display apparatus with excellent quality of display is achieved.

What is claimed is:

1. A method of producing an active matrix substrate for a liquid crystal display apparatus, said active matrix substrate having pixel electrodes each of which is provided with a thin film transistor at each intersecting point between plural signal lines and plural scanning lines perpendicular to the signal lines, comprising the steps of:

providing a substrate;

producing on the substrate a first insulation layer of silicon nitride;

producing on the first silicon nitride insulation layer a second insulation layer of silicone oxide by thermally oxidizing the surface of the first silicon nitride insulation layer;

producing a polycrystal silicon layer on the second silicone oxide insulation layer;

producing the thin film transistors in the polycrystal silicon layer;

forming insulation on the thin film transistors having through holes reaching to the source and drain regions of the thin film transistors;

forming respective electrodes on said insulation in contact with the source and drain regions, said respective electrodes being formed by depositing aluminum and thereafter laminating TiN on the deposited aluminum;

forming further insulation on said respective electrodes and the adjacent surface of said insulation, said further insulation having through holes reaching to the respective electrodes; and forming pixel electrodes on the said further insulation, each pixel electrode being in ohmic contact with an associated one of said respective electrodes.

2. A method according to claim 1, wherein said step of producing the first silicon nitride insulation layer is performed by a low pressure CVD process or by a plasma enhanced CVD process.

3. A method of producing a liquid crystal display apparatus, comprising the steps of:

producing an active matrix substrate according to either of claims 1 and 2;

disposing a substrate with a common electrode opposite the active matrix substrate; and providing a liquid crystal material between the active matrix substrate and the substrate disposed opposite thereto.

* * * * *

UNITED STATES PATENT AND TRADEMARK OFFICE
CERTIFICATE OF CORRECTION

PATENT NO.   : 6,097,453
DATED        : August 1, 2000
INVENTOR(S)  : AKIRA OKITA It is certified that error appears in the above-identified patent and that said Letters Patent is hereby corrected as shown below:

ON THE TITLE PAGE:

[56] References Cited, under FOREIGN PATENT DOCUMENTS

"5055582" should read --5-55582--;
"6132306" should read --6-132306--; and
"832083" should read --8-32083--.

Signed and Sealed this

Twenty-fourth Day of April, 2001

*Attest:*

NICHOLAS P. GODICI

*Attesting Officer*   Acting Director of the United States Patent and Trademark Office